(12) United States Patent
Wang et al.

(10) Patent No.: US 7,180,769 B2
(45) Date of Patent: Feb. 20, 2007

(54) WORLD LINE SEGMENT SELECT TRANSISTOR ON WORD LINE CURRENT SOURCE SIDE

(75) Inventors: Po-Kang Wang, San Jose, CA (US); Yin Rong, Campbell, CA (US); Hsu Kai Yang, Pleasanton, CA (US); Xizeng Shi, Fremont, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 11/103,977

(22) Filed: Apr. 12, 2005

(65) Prior Publication Data

US 2006/0227597 A1 Oct. 12, 2006

(51) Int. Cl.
*G11C 11/00* (2006.01)

(52) U.S. Cl. ........................ 365/157; 365/66; 365/225.5

(58) Field of Classification Search ................ 365/157, 365/66, 225.5
See application file for complete search history.

(56) References Cited

U.S. PATENT DOCUMENTS

| 5,315,541 | A | 5/1994 | Harari et al. ................. 365/63 |
| 5,887,002 | A * | 3/1999 | Cooke et al. ................ 714/725 |
| 6,335,890 | B1 | 1/2002 | Reohr et al. ............. 365/225.5 |
| 6,480,437 | B2 * | 11/2002 | Kato et al. ............. 365/230.03 |
| 6,490,217 | B1 | 12/2002 | DeBrosse et al. ........ 365/225.5 |
| 6,512,714 | B2 * | 1/2003 | Hanzawa et al. ........... 365/210 |
| 2002/0176272 | A1 | 11/2002 | DeBrosse et al. |
| 2004/0047172 | A1 | 3/2004 | Komatsuzaki |

* cited by examiner

*Primary Examiner*—Tuan T. Nguyen
(74) *Attorney, Agent, or Firm*—Saile Ackerman LLC; Stephen B. Ackerman

(57) ABSTRACT

The word line segment select transistor of a segmented word line array is placed on the word line current source side. This eliminates many undesirable effects currently associated with segmented word line MRAM arrays.

14 Claims, 3 Drawing Sheets

WORLD LINE SEGMENT SELECT TRANSISTOR ON WORD LINE CURRENT SOURCE SIDE

FIELD OF THE INVENTION

The invention relates to the general field of magnetic random access memory (MRAM) cell array architecture with particular reference to placement of the word line segment select transistor

BACKGROUND OF THE INVENTION

MTJs (Magnetic Tunnel Junction) and GMR (giant magneto-resistance) devices of MRAM cells are programmed by the cross point effect of word line and bit line currents. A major concern is the problem of cells on the same word line and bit lines being disturbed. Segmented word line approaches, as described for example in "Select Line Architecture for Magnetic Random Access Memories" (US patent application Publication: U.S. 2002/0176272 A1), eliminate the disturb condition for cells that are on the same word line but in a different segment.

A typical segmented word line array of the prior art is shown FIG. 1. The word line programming current goes through only the selected segmented word line source, the selected word line segment, and the word line segment select transistor to the segmented word line return. Thus, any memory elements outside this word line segment are not affected by the programming current.

Seen in FIG. 1 are read word line 11, write word line 12, and bit lines 13. Each of the latter intersects segmented word line 14 (which is driven by segment selection transistor 15) at a memory storage element 16 where a local magnetic field is generated that is strong enough to influence the device's free layer. The state of the free layer is detected during the read cycle when isolation transistor 17 is activated by read world line 11. It is important to note that segment selection transistor 15 is located so that it connects the segment 18 directly to the current source return line.

So, in this design, the word line current source of word line segments are all connected together. As the array grows, the capacitance associated with these word line segments becomes large enough to cause a number of problems. Loading and noise due to coupling between the word lines and bit lines are obvious examples. The charge stored on a word line segment can produce a big enough current spike to disturb bytes controlled by the same write word line when a byte on other blocks is being programmed. The present invention discloses a method of eliminating these problems.

A routine search of the prior art was performed with the following references of interest being found:

U.S. Pat. No. 6,335,890 (Roehr et al) discloses global and local word lines where the global word lines are isolated from the memory cells, write lines and bit lines orthogonal, and a switch for each word line segment. The gate terminal is "operatively connected to the group select signal, and the drain and source terminals being operatively connected between the write line current return conductor and the segmented write line conductor corresponding to the segmented group."

U.S. Pat. No. 6,490,217 and U.S. Patent Application 200210176272 (DeBrosse et al) teach the word line current source of all the word lines connected together.

U.S. Pat. No. 5,315,541 (Harari et al) shows two select transistors, one on the drain bit line and on the source bit line.

U.S. Patent Application 2004/0047172 (Komatsuzaki) teaches segmented word lines, bit lines, and plate lines.

SUMMARY OF THE INVENTION

It has been an object of at least one embodiment of the present invention to eliminate undesirable effects associated with segmented word lines of the prior art.

Another object of at least one embodiment of the present invention has been to isolate these word line segment from any loading by any other segment of a memory array Still another object of at least one embodiment of the present invention has been to ensure that no residual charge is stored in said array to cause any current spikes during subsequent programming cycles These objects have been achieved by placing the word line segment select transistor at the word line current source side. With this configuration, many undesirable effects associated with segmented word line MRAM arrays of the prior art are eliminated.

DESCRIPTION OF THE PREFERRED EMBODIMENTS

Figure 1:
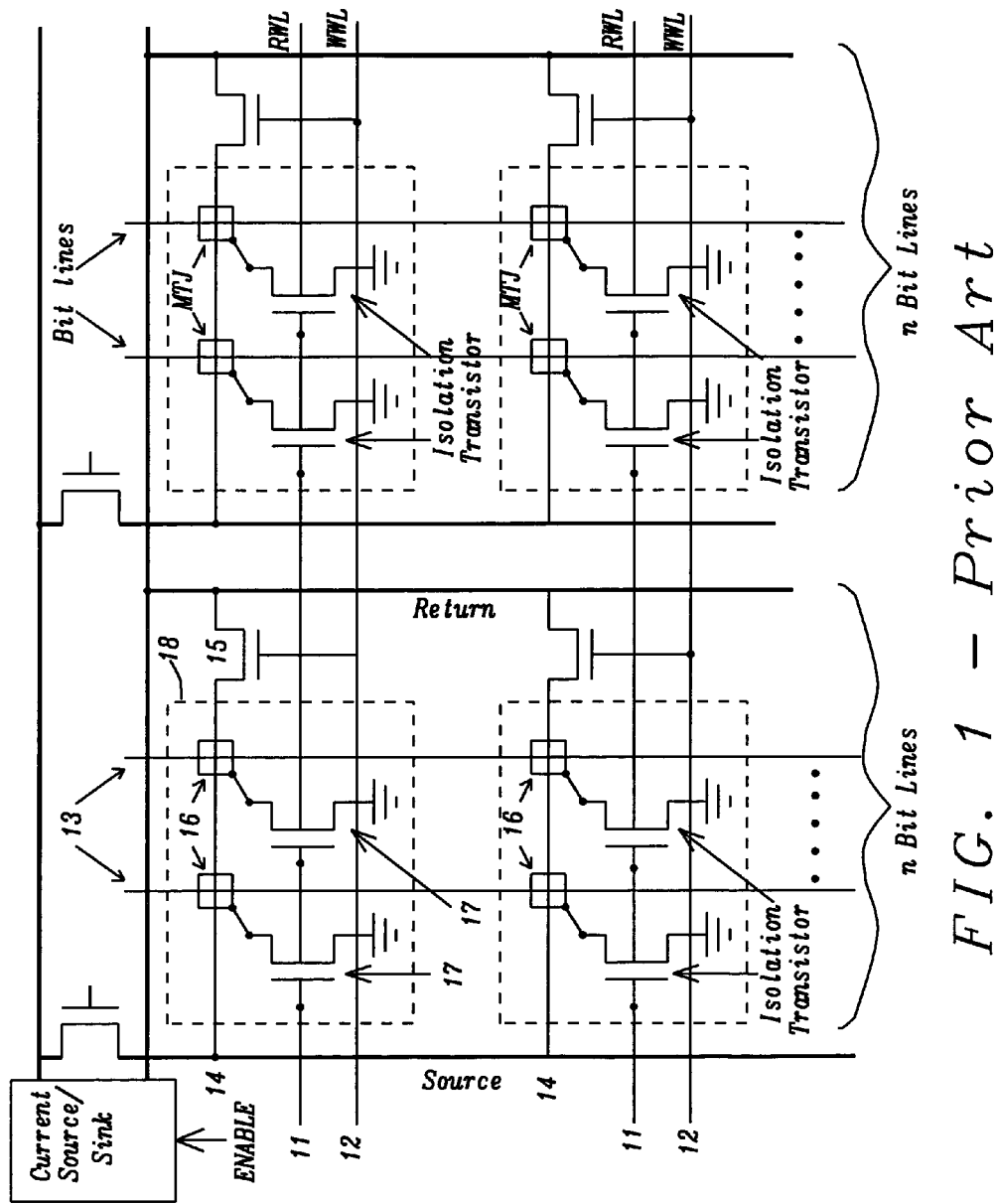
FIG. 1 shows a Segmented Word Line MRAM array of the prior art.
Figure 2:
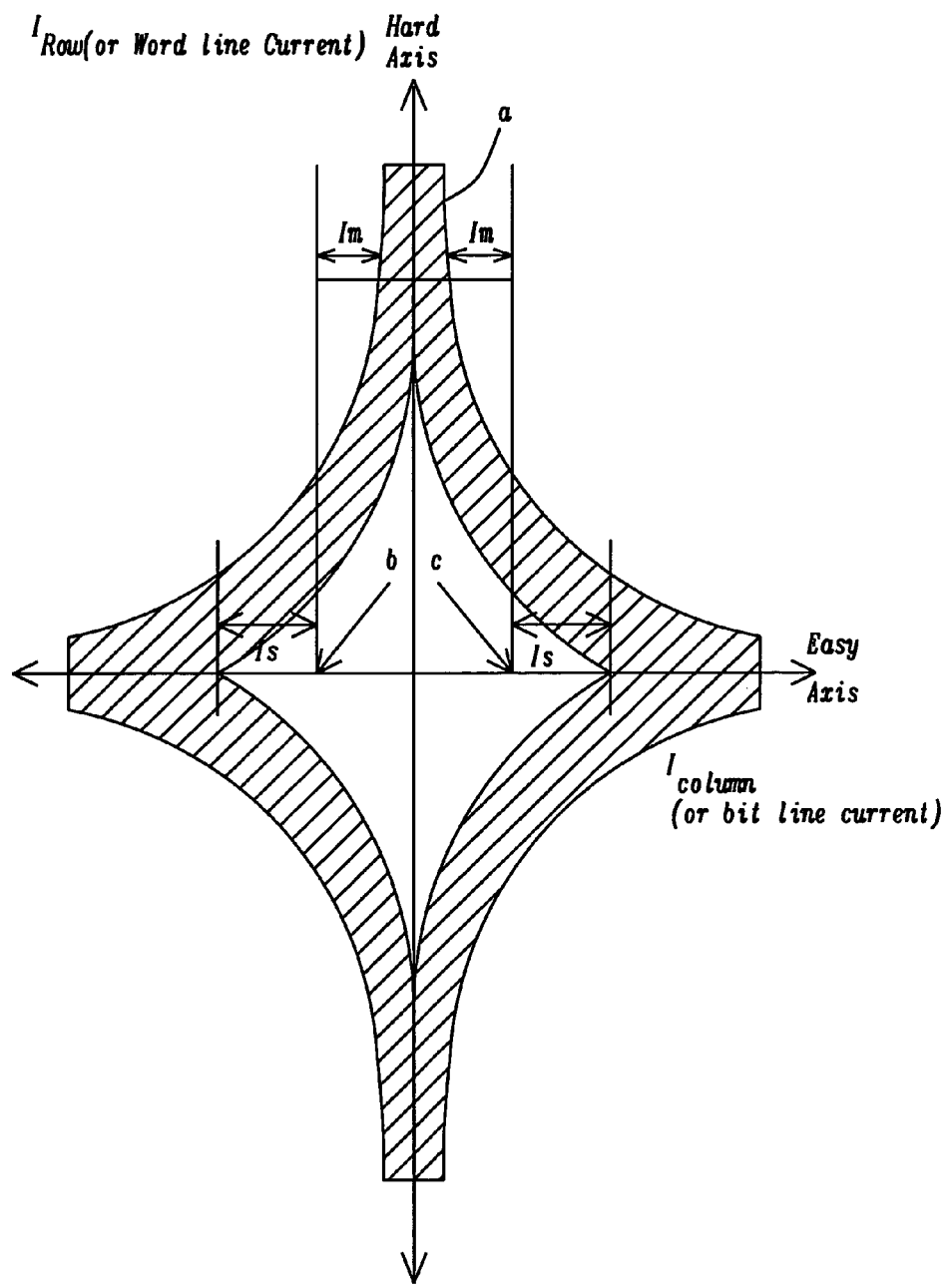
FIG. 2 is a composite Asteroid Chart of MTJs within an MRAM array.

In FIG. 2, the composite characteristics of MTJs within an array is shown on an asteroid chart as shaded areas. With a segmented word line array, the word line current can be biased into a region where only very small bi-directional bit line currents are needed to program the devices.

As an example, let the Word Line current be biased at the point a and the bi-directional bit line currents at b and c. The margin to ensure programming of all bits within the array are shown as IM and the safety margin for not disturbing any bits along the bit lines are shown as Is.

Figure 3:
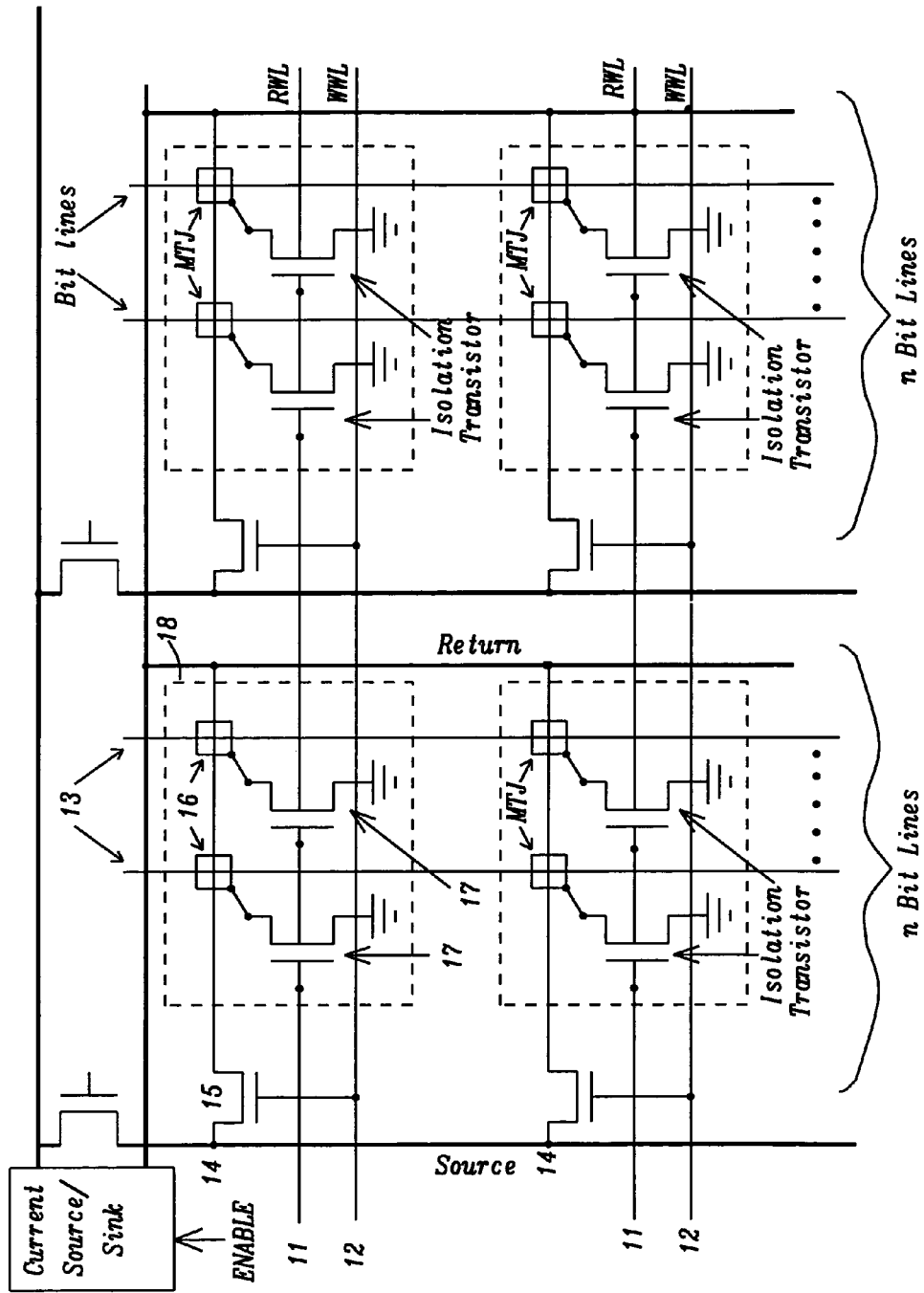
FIG. 3 illustrates the Segmented Word Line MRAM array of the present invention.

By placing the word line segment select transistor 15 between the segmented word line current source and word line segment 18 (so that it will pass over all storage elements in the segment before making contact with the current return line), as shown in FIG. 3, the loading of all word line segments has been effectively isolated from one another. Only the selected word line segment 18 will act as a load for the current source, instead of the entire block of word line segments. Thus, the word line current source sees a much smaller load. The number of memory elements in a given segment is typically between about 8 and 64.

It should be noted that, after a programming cycle, there is no residual charge stored in the array to cause any current spikes during subsequent programming cycles. Note also that the selection transistor can be any one of several transistor types such as MOSFETs or bipolar devices.

Finally, the current source and return lines can be connected to additional segments so as to form a number of MRAM blocks among whom only a selected word line segment will act as a load for the current source. The full array can then be fashioned out of a two dimensional matrix of such MRAM blocks.

What is claimed is:

1. A method to improve a segment of a segmented word line array, comprising:

providing a current source-and-sink that drives, and is driven by, parallel source and return lines respectively;

providing read and write word lines that are orthogonal to said source and return lines;

providing a number of bit lines that are parallel to said source and return lines and disposing each bit line to pass directly over a memory element having a bottom electrode, whereby said segment contains said number of corresponding memory elements;

providing one isolation transistor for each one of said memory elements, each isolation transistor having a first source, a first gate, and a first drain;

connecting each first source to its corresponding bottom electrode;

connecting each first gate to said read word line;

connecting each first drain to ground;

providing a word line selection transistor having a second source, a second gate, and a second drain;

connecting said second source to said source line;

connecting said second gate to said write word line; and connecting said second drain to said return line through a line that passes directly over all of said corresponding memory elements prior to contacting said return line, thereby isolating said segment from any loading by any other segment of said array.

2. The method of claim 1 wherein said word line selection transistor is selected from the group consisting of MOSFETs and bipolar devices.

3. The method of claim 1 wherein said memory element is selected from the group consisting of magnetic tunnel junctions and GMR devices.

4. The method of claim 1 wherein said number of memory elements in said segment is between about 8 and 64.

5. The method of claim 1 further comprising connecting said source and return lines to additional segments, thereby forming a plurality of MRAM blocks among whom only a selected word line segment will act as a load for the current source-and-sink.

6. The method of claim 5 further comprising forming said array from a two dimensional matrix of said MRAM blocks.

7. The method of claim 1 wherein there is no residual charge stored in said array to cause any current spikes during subsequent programming cycles.

8. An improved segment of a segmented word line array, comprising:

a current source-and-sink that drives, and is driven by, parallel source and return lines respectively;

read and write word lines that are orthogonal to said source and return lines;

a number of bit lines that are parallel to said source and return lines, each such bit line being disposed to pass directly over a memory element having a bottom electrode, whereby said segment contains said number of corresponding memory elements;

one isolation transistor for each one of said memory elements, each isolation transistor having a first source, a first gate, and a first drain;

each first source connected to its corresponding bottom electrode;

each first gate connected to said read word line;

each first drain connected to ground;

a word line selection transistor having a second source, a second gate, and a second drain;

said second source connected to said source line;

said second gate connected to said write word line; and said second drain connected to said return line through a line that passes directly over all of said corresponding memory elements prior to contacting said return line, whereby any loading of said segment by any other segment of said array is excluded.

9. The improved segment of claim 8 wherein said word line selection transistor is selected from the group consisting of MOSFETs and bipolar devices.

10. The improved segment of claim 8 wherein said memory element is selected from the group consisting of magnetic tunnel junctions and GMR devices.

11. The improved segment of claim 8 wherein said number of memory elements in said segment is between about 8 and 64.

12. The improved segment of claim 8 further comprising said source and return lines being connected to additional segments, whereby there is a plurality of MRAM blocks among whom only a selected word line segment will act as a load for the current source-and-sink.

13. The improved segment of claim 12 wherein said array is a two dimensional matrix of said MRAM blocks.

14. The improved segment of claim 8 wherein no residual charge is stored in said array to cause any current spikes during subsequent programming cycles.

* * * * *